(12) United States Patent
Cloud et al.

(10) Patent No.: US 6,498,739 B2
(45) Date of Patent: *Dec. 24, 2002

(54) APPLICATIONS FOR NON-VOLATILE MEMORY CELLS

(75) Inventors: Eugene H. Cloud, Boise, ID (US); Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/968,643

(22) Filed: Oct. 1, 2001

(65) Prior Publication Data

US 2002/0015322 A1 Feb. 7, 2002

Related U.S. Application Data

(62) Division of application No. 09/261,597, filed on Feb. 26, 1999, now Pat. No. 6,297,989.

(51) Int. Cl.⁷ ................................................. G11C 5/02
(52) U.S. Cl. ........................ 365/51; 365/63; 438/253; 438/396
(58) Field of Search ...................... 365/51, 63; 438/241, 438/258, 253–256, 396–399; 257/306–311

(56) References Cited

U.S. PATENT DOCUMENTS

| 4,051,354 A | 9/1977 | Choate ........................ 235/312 |
| 4,761,768 A | 8/1988 | Turner et al. ................ 365/201 |
| 4,766,569 A | 8/1988 | Turner et al. ................ 365/185 |
| 5,057,448 A | 10/1991 | Kuroda ........................ 438/258 |
| 5,196,722 A | 3/1993 | Bergendahl et al. ......... 257/304 |
| 5,247,346 A | 9/1993 | Hazani ........................ 257/314 |
| 5,250,857 A | 10/1993 | Miyazaki .................... 307/449 |
| 5,324,681 A | 6/1994 | Lowrey et al. ............... 437/52 |
| 5,327,380 A | 7/1994 | Kersh, III et al. .......... 365/195 |

(List continued on next page.)

OTHER PUBLICATIONS

Abbas, S.A., et al., "N–Channel Igfet Design Limitations Due to Hot Electron Trapping", *Technical Digest, International Electron Devices Meeting,*, Wahington, DC, pp. 35–38, (Dec. 1975).

Bude, J.D., et al., "Secondary Electron Flash—a High Performance, Low Power Flash Technology for 0.35 micrometer and Below", *International Electron Devices Meeting, Technical Digest*, Held in Washngton, D.C., 279–282, (Dec. 7–10, 1997).

(List continued on next page.)

*Primary Examiner*—Hoai Ho
*Assistant Examiner*—Gene N. Auduong
(74) *Attorney, Agent, or Firm*—Schwegman, Lundberg, Woessner & Kluth, P.A.

(57) ABSTRACT

Applications and methods for DRAM technology compatible non-volatile memory cells are presented. An example illustrating the applications and methods includes a circuit switch. The circuit switch has a non-volatile memory cell which a metal oxide semiconductor field effect transistor (MOSFET) formed in a semiconductor substrate, a capacitor, and a vertical electrical via coupling a bottom plate of the capacitor through an insulator layer to a gate of MOSFET. A wordline is coupled to a top plate of the capacitor in the non-volatile memory cell. A sourceline is coupled to a source region of the MOSFET in the non-volatile memory cell. A bit line is coupled to a drain region of the MOSFET in the non-volatile memory cell and coupled to a logic/select circuit.

33 Claims, 10 Drawing Sheets

U.S. PATENT DOCUMENTS

| | | | |
|---|---|---|---|
| 5,331,188 A | | 7/1994 | Acovic et al. ............... 257/298 |
| 5,347,490 A | | 9/1994 | Terada et al. ............... 365/219 |
| 5,416,735 A | | 5/1995 | Onishi et al. ............... 365/145 |
| 5,591,658 A | | 1/1997 | Cacharelis ................. 438/201 |
| 5,595,929 A | | 1/1997 | Tseng .......................... 437/52 |
| 5,598,367 A | | 1/1997 | Noble ......................... 365/149 |
| 5,612,238 A | * | 3/1997 | Sato et al. .................. 438/258 |
| 5,621,233 A | | 4/1997 | Sharma et al. .............. 257/316 |
| 5,723,375 A | * | 3/1998 | Ma et al. .................... 438/258 |
| 5,748,530 A | | 5/1998 | Gotou et al. ........... 365/185.18 |
| 5,763,913 A | | 6/1998 | Jeong .......................... 257/316 |
| 5,764,096 A | | 6/1998 | Lipp et al. .................. 327/434 |
| 5,825,609 A | * | 10/1998 | Andricacos et al. ........ 257/295 |
| 5,886,379 A | | 3/1999 | Jeong .......................... 257/319 |
| 5,908,311 A | | 6/1999 | Chi et al. .................... 438/258 |
| 5,912,840 A | | 6/1999 | Gonzalez et al. ...... 365/185.05 |
| 5,981,335 A | | 11/1999 | Chi .............................. 438/253 |
| 5,998,250 A | * | 12/1999 | Andricacos et al. ........ 438/240 |
| 6,015,986 A | | 1/2000 | Schuegraf .................... 257/303 |
| 6,256,225 B1 | * | 7/2001 | Noble et al. ........... 365/185.05 |
| 6,297,989 B1 | * | 10/2001 | Cloud et al. ........... 365/185.08 |
| 6,319,773 B1 | * | 11/2001 | Noble et al. ................ 438/258 |

OTHER PUBLICATIONS

Choi, J.D., et al., "A Triple Polysilicon Stacked Flash Memory Cell with Wordline Self–Boosting Programming", *International Electron Devices Meeting, Technical Digest*, Held in Washington, D.C., 283–286, (Dec. 7–10, 1997).

Chung, S.S., et al., "Performance and Reliability Evaluations of P–Channel Flash Memories with Different Programming Schemes", *International Electron Devices Meeting, Technical Digest*, Washington, D.C., 295–298, (Dec. 1997).

Crowder, S., et al., "Trade–offs in the Integration of High Performance Devices with Trench Capacitor DRAM", *Dig. Int. Electron Devices Meeting, Washington, D.C.*, pp. 45–48, (Dec. 1997).

Forbes, L., et al., "Field Induced Re–Emission of Electrons Trapped in SiO", *IEEE Transactions on Electron Devices, ED–26 (11)*, Briefs, pp. 1816–1818, (Nov. 1979).

Hodges, D.A., et al., *Analysis and Design of Digital Integrated Circuits*, McGraw–Hill Book Company, 2nd Edition, 394–396, (1988).

Hwang, N., et al., "Tunneling and Thermal Emission of Electrons from a Distribution of Deep Traps in SiO", *IEEE Transactions on Electron Devices, 40(6)*, pp. 1100–1103, (Jun. 1993).

Ishiuchi, H., et al., "Embedded DRAM Technologies", *IEDM Technical Digest*, 33–36, (1997).

Kang, H.K., et al., "Highly Manufacturable Process Technology for Reliable 256 Mbit and 1 Gbit DRAMs", *IEEE*, 635–638, (1994).

Kato, M., et al., "A Shallow–Trench–Isolation Flash Memory Technology with a Source–Bias Programming Method", *International Electron Devices Meeting, Technical Digest*, Held in San Francisco, CA, 177–180, (Dec. 8–11, 1996).

Kobayashi, T., et al., "A 0.24–micrometer Cell Process with 0.18–micrometer Width Isolation and 3–D Interpoly Dielectric Films for 1–Gb Flash Memories", *International Electron Devices Meeting, Technical Digest*, Held in Washington, D.C., 275–278, (Dec. 7–10, 1997).

Oashi, T., et al., "16Mb DRAM/SOI Technologies for Sub–1V Operation", *International Electron Devices Meeting, Technical Digest*, Held in San Francisco, CA, 609–612, (Dec. 8–11, 1996).

Shen, S., et al., "Novel Self–Convergent Programming Scheme for Multi–Level P–Channel Flash Memory", *International Electron Devices Meeting, Technical Digest*, Held in Washington, D.C., 287–290, (Dec. 7–10, 1997).

Shimizu, K., et al., "A Novel High–Density 5F NAND STI Cell Technology Suitable for 256Mbit and 1Gbit Flash Memories", *IEEE*, 271–274, (1997).

Sunouchi, K., et al., "240nm Pitch 4GDRAM Array MOSFET Tecnologies with X–ray Lithography", *International Electron Devices Meeting, Technical Digest*, Held in San Francisco, CA, 601–604, (Dec. 8–11, 1996).

Togo, M., et al., "A Salicide–Bridged Trench Capacitor with a Double–Sacrificial–Si N–Sidewall (DSS) for High–Performance Logic–Embedded DRAMs", *International Electron Devices Meeting, Technical Digest*, 37–40, (1997).

\* cited by examiner

APPLICATIONS FOR NON-VOLATILE MEMORY CELLS

This application is a Divisional of U.S. application Ser. No. 09/261,597, filed on Feb. 26, 1999 now U.S. Pat. No. 6,297,989.

RELATED APPLICATIONS

This application is related to the co-filed and commonly assigned applications, attorney docket number 303.556US1, entitled "Dram Technology Compatible Non-volatile Memory Cells," by Wendell P. Noble and Eugene H. Cloud, attorney docket number 303.583US1, entitled "Dram Technology Compatible Processor/Memory Chips," by Leonard Forbes, Eugene H. Cloud, and Wendell P. Noble, and attorney docket number 303.584US1, entitled "Construction and Applications for Non-volatile Reprogrammable Switches," by Wendell P. Noble and Eugene H. Cloud which are hereby incorporated by reference and filed of even date herewith.

FIELD OF THE INVENTION

The present invention relates generally to semiconductor integrated circuits and, more particularly, to applications for non-volatile memory cells.

BACKGROUND OF THE INVENTION

Many products need various amounts of memory. Two of the most useful types of memory are high speed, low cost memory typically implemented as dynamic random access memory (DRAM) and non-volatile memory typically implemented as electrically erasable and programmable read only memory (EEPROM) or Flash memory.

This invention relates to non-volatile memory cells being used in conjunction with DRAM memory cells. Micron Technology, Inc. taught in U.S. Pat. No. 5,324,681 which issued to Lowrey et al. on Jun. 28, 1994, that one time programmable (OTP) memory cells could be used to replace laser/fuse programmable memory cells for applications such as OTP repair of DRAMs using redundant rows and columns of DRAM memory cells and OTP selection of options on a DRAM (such as fast page mode (FPM) or extended data out (EDO)). One of the key advantages of that capability is the ability to program the OTP memory cells after the DRAM memory chip is packaged (a decided advantage over previous solutions).

The antifuse integrally combines the functions of a switching element which makes the interconnection and a programming element which stores the state of the switching element, either "off" or "on." Thus an antifuse occupies little space on the integrated circuit, but has the disadvantage of not being reprogrammable. This single-time programmability makes the antifuse difficult to test and unsuitable for a large class of applications where reprogrammability is required.

Alternative programmable interconnects use a metal oxide semiconductor field programmable transistor (MOSFET) as the switching element. The MOSFET is controlled by the stored memory bit of a programming element. Most commonly, this programming element is a dynamic random access memory (DRAM) cell. Such DRAM based FPGAs are reprogrammable, but the programming of the switching elements is lost whenever power is turned off. A separate, non-volatile memory cell must be used to store the programmed pattern on power down, and the FPGA must be reprogrammed each time the device is powered back up.

It is further desirable to implement non-volatile memory cells along with DRAM cells to provided shadow RAM cells. An example of conventional shadow RAM cells is taught in U.S. Pat. No. 5,196,722 issued to Bergendahl et al. on Mar. 23, 1993. However, the process steps involved there are lengthy and do not fit well with an optimized DRAM technology process flow.

The ability to combine DRAM and non-volatile, e.g. EEPROM, styles of memory, especially if little or no additional manufacturing complexity is required, would facilitate a number of cost effective applications, as described above, which do not currently exist or that, heretofore were too costly to be commercially viable.

Thus, there is a need for additional applications for DRAM technology compatible non-volatile memory cells. It is desirable that such DRAM technology non-volatile memory cells be fabricated on a DRAM chip with little or no modification of the DRAM optimized process flow. It is further desirable that such DRAM technology non-volatile memory cells operate with lower programming voltages than that used by conventional non-volatile memory cells, yet still hold sufficient charge to withstand the effects of parasitic capacitances and noise due to circuit operation.

SUMMARY OF THE INVENTION

The above mentioned problems for merging additional applications for DRAM technology compatible non-volatile memory cells onto the DRAM chip as well as other problems are addressed by the present invention and will be understood by reading and studying the following specification. The present invention includes a compact non-volatile memory cell structure formed using a DRAM process technology.

The present invention employs DRAM technology compatible non-volatile memory cells for implementations which dramatically improves on the prior art. An example of one such application includes a circuit switch. The circuit switch has a non-volatile memory cell which has a metal oxide semiconductor field effect transistor (MOSFET) formed in a semiconductor substrate, a capacitor, and a vertical electrical via coupling a bottom plate of the capacitor through an insulator layer to a gate of MOSFET. A wordline is coupled to a top plate of the capacitor in the non-volatile memory cell. A sourceline is coupled to a source region of the MOSFET in the non-volatile memory cell. A bit line is coupled to a drain region of the MOSFET in the non-volatile memory cell and coupled to logic/select circuit.

Another example of an application includes a shadow random access memory (RAM) cell. The shadow RAM cell has a non-volatile memory cell with the structure described above. Other implementations of the present invention may similarly be included.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1:
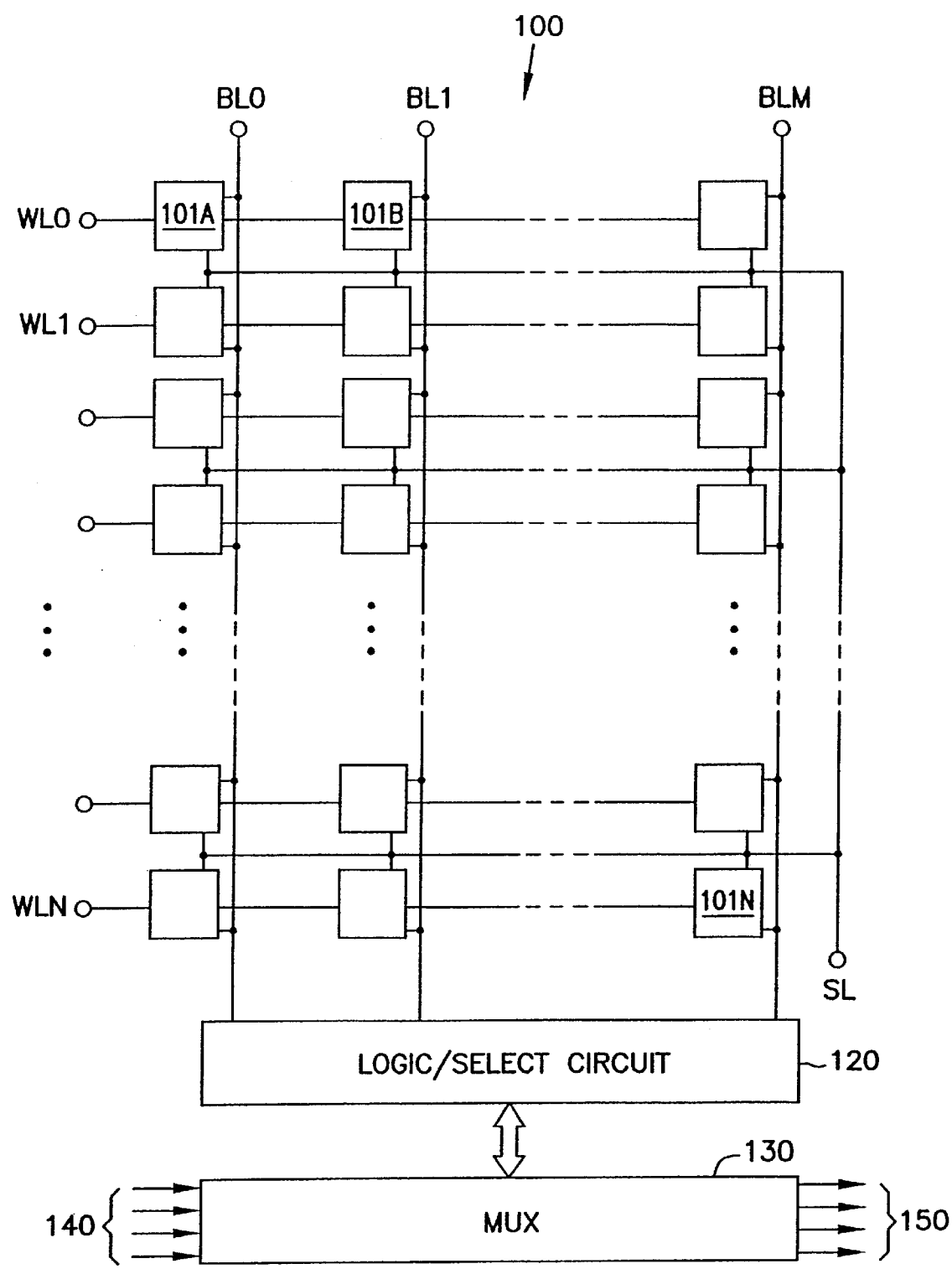
FIG. 1 is a block diagram of a circuit switch array according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a block diagram of a circuit switch array 100 according to the teachings of the present invention. In FIG. 1, a number of non-volatile memory cells are shown as 101A, 101B, . . . , 101N. FIG. 1 illustrates one arrangement of the non-volatile memory cells, 101A, 101B, . . . , 101N. Any number of non-volatile memory cells 101A, 101B, . . . , 101N may be interconnected in any parallel or series arrangement to execute complex switching requirements. As shown in FIG. 1, a number of control lines, or wordlines, WL0, WL1, . . . , WLN, couple to the number of non-volatile memory cells, 101A, 101B, . . . , 101N. Additionally, a sourceline, SL, is shown coupled to the number of non-volatile memory cells, 101A, 101B, . . . , 101N. A number of bit lines, BL0, BL1, . . . , BLM, are coupled to the number of non-volatile memory cells, 101A, 101B, . . . , 101N, in the circuit switch array. The number of bit lines, BL0, BL1, . . . , BLM, are further coupled to a logic select circuit 120. The logic/select circuit 120 further couples with a multiplexor 130. The multiplexor 130 couples a number of input circuit lines, shown collectively as 140, to a number of output circuit lines, shown collectively as 150. In one embodiment, the multiplexor 130 couples one of the number of input circuit lines 140 to a first one of the output circuit lines 150 when a non-volatile memory cell, e.g. 101A, is in a first programmed state. In an alternative embodiment, the multiplexor 130 couples a first set of the number of input circuit lines 140 to a first set of the number of output circuit lines 150 when a non-volatile memory cell, e.g. 101A, is in a first programmed state. In this embodiment, the multiplexor 130 couples a first set of the input circuit lines 140 to a second set of the number of output circuit lines 150 when a non-volatile memory cell, e.g. 101A, is in a second programmed state. In one embodiment, the number of output circuit lines include a number of redundant output circuit lines, e.g. a number of redundant DRAM wordlines or bit lines. One of ordinary skill in the art will understand upon reading this disclosure the various suitable manners in which the logic/select circuit 120 may be constructed to cause the multiplexor 130 to switch coupling between the number of input circuit lines 140 and the number of output circuit lines based upon the programmed state of the non-volatile memory cell, e.g. 101A. The same is not discussed in detail here so as not to obscure the inventive features to the present application, one of which includes the application of a novel non-volatile memory cell 101A in the above circuit implementation.

Figure 2:
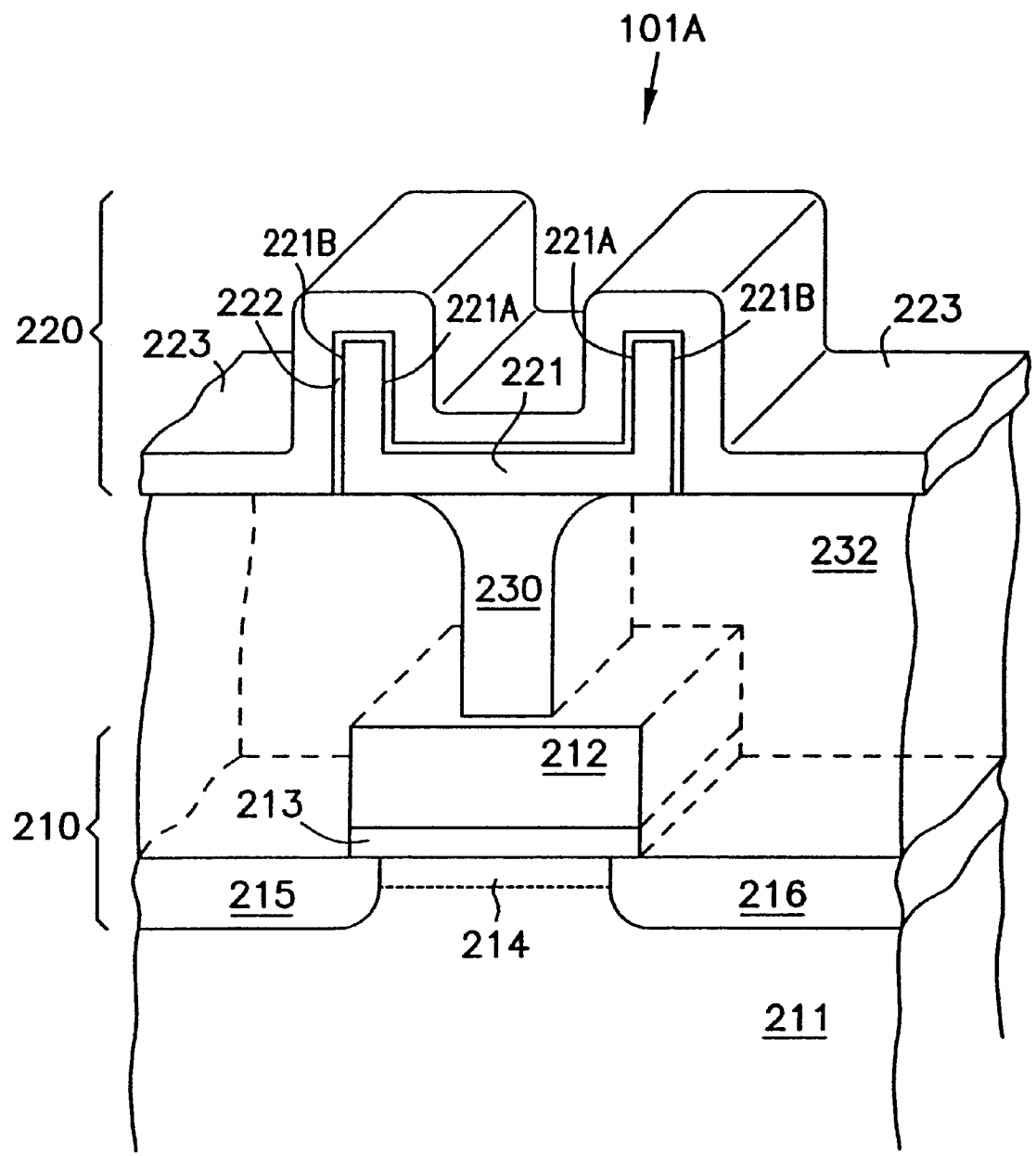
FIG. 2 is a perspective view illustrating in detail the make up of each of the non-volatile memory cells shown in FIG. 1 according to the teachings of the present invention.

FIG. 2 is a perspective view illustrating in detail the make up of the non-volatile memory cell, e.g. 101A, according to the teachings of the present invention. The non-volatile memory cell 101A includes all the embodiments of the non-volatile memory cell structure presented and described in detail in the co-filed application attorney docket number 303.556us1, entitled "DRAM Technology Compatible Non-volatile Memory Cells," by Wendell P. Noble and Eugene H. Cloud, which is hereby incorporated by reference in its entirety for purposes of enablement.

As shown in FIG. 2, the non-volatile memory cell structure 101A includes a MOSFET 210 and a capacitor 220 fabricated using conventional DRAM process steps. In one embodiment, the MOSFET 210 includes an n-channel metal oxide semiconductor (NMOS) transistor 210 formed in a semiconducting substrate 211. The MOSFET 210 includes a gate 212 separated by a gate oxide 213 from a channel region 214 of the MOSFET 210. In one embodiment, the gate oxide 213 has a thickness of less than 100 Angstroms (Å) and acts as a tunneling oxide. Gate 212 includes a polysilicon gate 212, a polycide gate 212, salicided gate structure, or other conductive gate material as known to one of ordinary skill in the art of DRAM transistor fabrication.

The channel region 214 couples a first diffused region 215 to a second diffused region 216. The DRAM transistor is formed according to a conventional, DRAM optimized process flow, as is known to those of ordinary skill in the art of DRAM chip fabrication.

As shown in FIG. 2, the capacitor 220 is formed in a subsequent layer above the MOSFET 210. The capacitor 220 is separated from the MOSFET 210 by an insulator layer 232. Capacitor 220 includes a bottom plate 221 and a top plate 223, or a control gate 223 which is separated from the bottom plate 221 by a dielectric layer or capacitor dielectric 222. The bottom plate 221 serves as a storage node 221 and the top plate serves as a plate capacitor 223 for the capacitor 220. The bottom plate 221 comprises a floating gate 221 for the non-volatile memory cell 101A which is connected through capacitor dielectric 232 to gate 212 by an electrical contact 230. In one embodiment, the entire stack 221, 230 and 212 serves as a floating gate. The top plate 223 comprises a control gate 223 for the non-volatile memory cell 200. In one embodiment, shown in FIG. 2, capacitor 220 includes a stacked capacitor which is cup shaped 220. The bottom plate 221 has interior walls 221A and exterior walls 221B. The capacitor dielectric 222 is conformal to the interior walls 221A and the exterior walls 221B of the bottom plate 221. The top plate 223 is conformal to the capacitor dielectric 222. A portion of the top plate 223 is located within and opposes the interior walls 221A of the bottom plate 221, separated therefrom by the capacitor dielectric 222. A portion of the top plate 223 is locate outside of and opposes the exterior walls 221B of the bottom plate 221, separated therefrom by the capacitor dielectric 222. In one embodiment, the capacitor dielectric has a thickness of less than the equivalent of 100 Angstroms (Å) of $SiO_2$.

Figure 3:
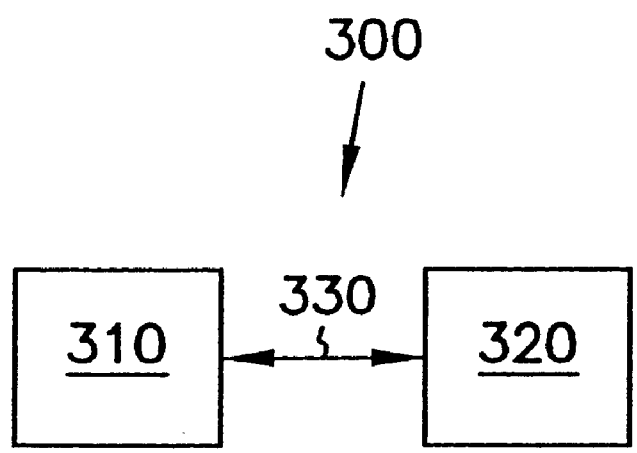
FIG. 3, is a block diagram showing an electronic system according to the teachings of the present invention.

FIG. 3, is a block diagram showing an electronic system according to the teachings of the present invention. In FIG. 3, a processor 310 is coupled to a DRAM chip 320 by a system bus 330. The system bus 330 includes any system bus suitable for communicating data between the processor 310 and the DRAM chip 320. The DRAM chip 320 includes a circuit switch, e.g. 101A, as would be included with the circuit switch array 100 shown and described in detail above in connection with FIG. 1.

Figure 4:
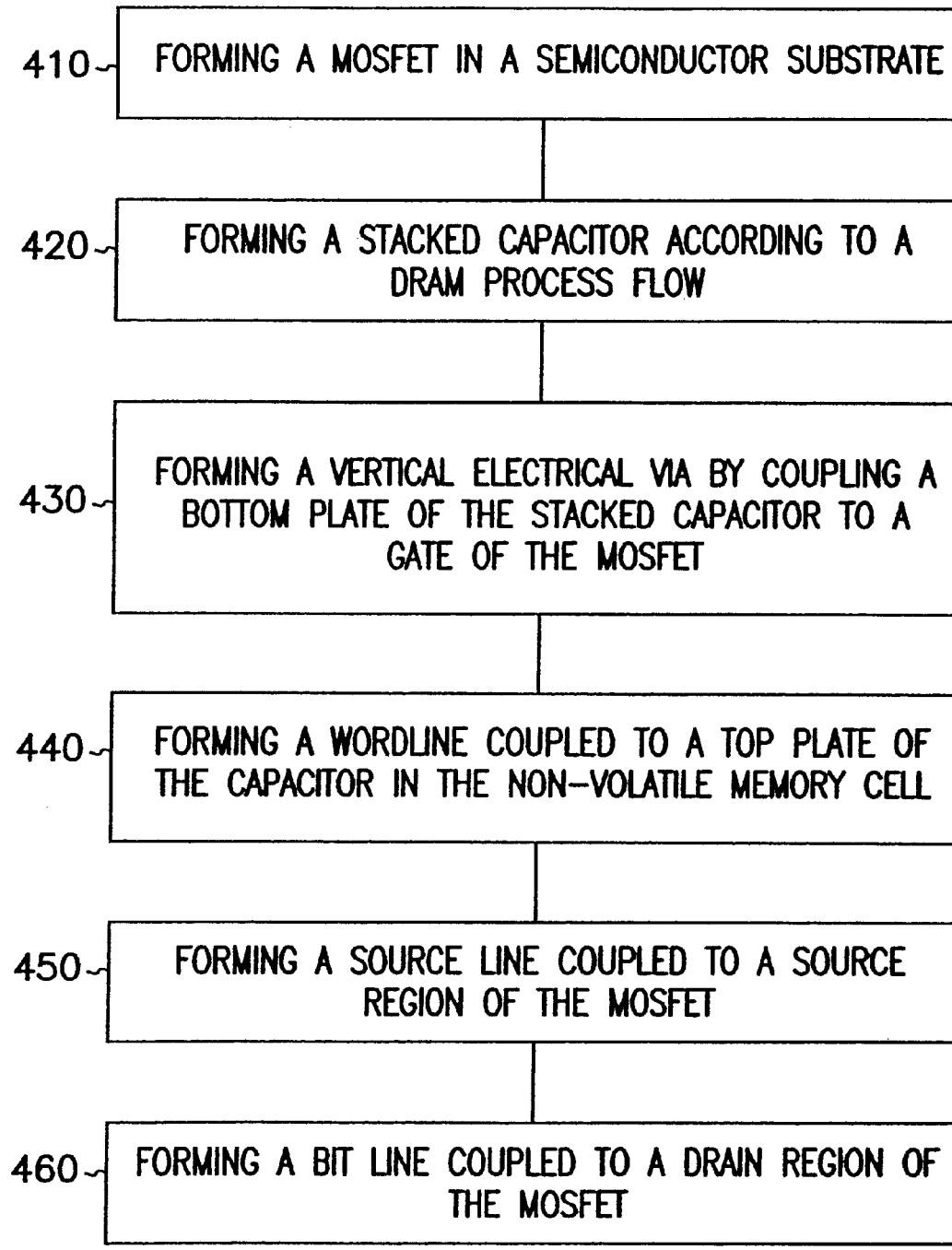
FIG. 4 illustrates, in flow diagram form, a method of for forming a non-volatile memory cell according to the teachings of the present invention.

FIG. 4 illustrates, in flow diagram form, a method of for forming a non-volatile memory cell according to the teachings of the present invention. The method includes forming a metal oxide semiconductor field effect transistor (MOSFET) in a semiconductor substrate 410. The method further includes forming a stacked capacitor according to a dynamic random access memory (DRAM) process flow 420. A vertical electrical via electrical via is formed where forming the vertical electrical via includes coupling a bottom plate of the stacked capacitor through an insulator layer to a gate of MOSFET 430. A wordline is formed coupled to a top plate of the capacitor in the non-volatile memory cell 440. A sourceline is formed coupled to a source region of the MOSFET in the non-volatile memory cell 450. The method further includes forming a bit line coupled to a drain region of the MOSFET in the non-volatile memory cell and coupled to logic/select circuit 460. In one embodiment, forming the stacked capacitor includes forming the bottom plate of the stacked capacitor in a cup shape having interior walls and exterior walls and is separated by a capacitor dielectric from the top plate. In this embodiment, wherein forming the capacitor dielectric includes forming the capacitor dielectric conformal to the bottom plate, and forming the top plate conformal to the capacitor dielectric, a portion of the top plate being located within the interior walls of the bottom plate. In one embodiment, forming the non-volatile memory cell includes forming an EEPROM cell. In one embodiment of FIG. 4, forming the logic/select circuit includes coupling the logic/select circuit to a multiplexor, and coupling a first circuit line and second circuit line to the multiplexor such that the multiplexor couples the first circuit line to the second circuit line when the non-volatile memory cell is in a first programmed state, and such that the multiplexor decouples the first circuit line from the second circuit line when the non-volatile memory cell is in a second programmed state. In this embodiment of FIG. 4, coupling the second circuit line to the multiplexor includes coupling a redundant DRAM wordline to the multiplexor.

Figure 5:
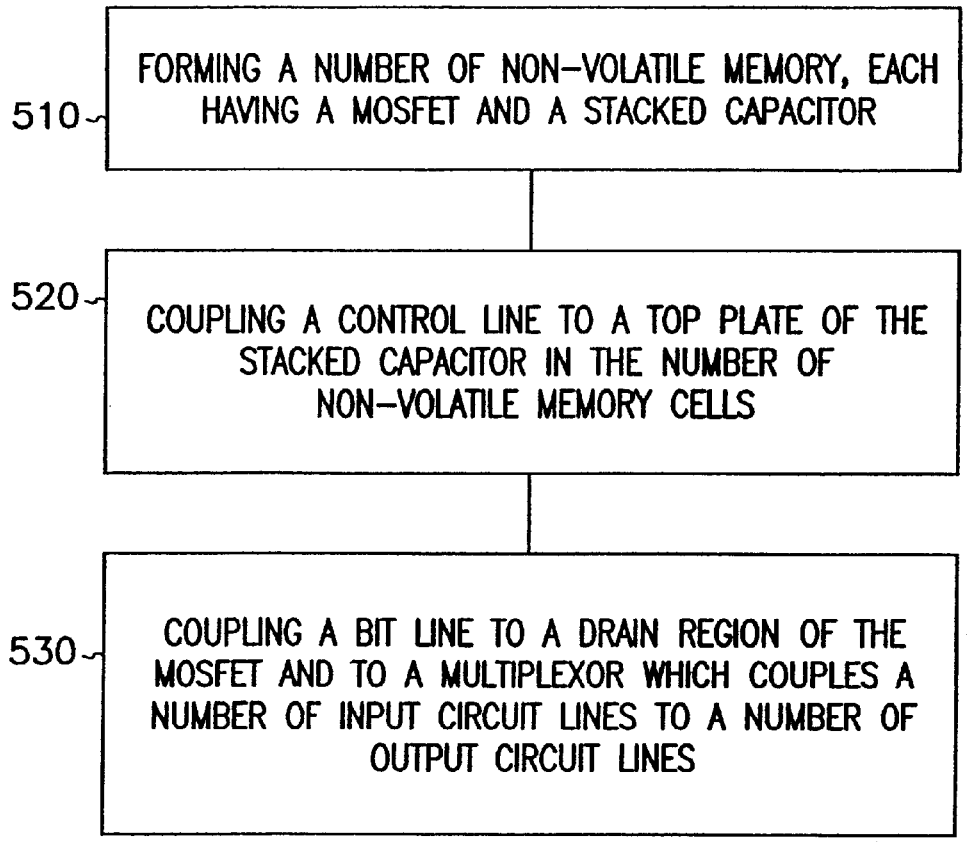
FIG. 5 illustrates, in flow diagram form, a method for forming a circuit switch array according to the teachings of the present invention.

FIG. 5 illustrates, in flow diagram form, a method for forming a circuit switch array according to the teachings of the present invention. The method includes forming a number of non-volatile memory cells 510. Forming each non-volatile memory cell includes forming a metal oxide semiconductor field effect transistor (MOSFET) in a semiconductor substrate. A stacked capacitor is formed according to a dynamic random access memory (DRAM) process in a subsequent layer above the MOSFET and separated from the MOSFET by an insulator layer. An electrical contact is formed coupling the bottom plate of the stacked capacitor through the insulator layer to the gate of MOSFET. The method further includes coupling a control line to a top plate of the stacked capacitor in the number of non-volatile memory cells 520. A sourceline is coupled to a source region of the MOSFET in the number of non-volatile memory cells. The method includes coupling a bit line to a drain region of the MOSFET in the number of non-volatile memory cells and coupling the bit line to a multiplexor which couples a number of input circuit lines to a number of output circuit lines 530.

In one embodiment, coupling the bit line to a multiplexor includes coupling the bit line to a logic/select circuit and coupling the logic/select circuit to the multiplexor. In the method of FIG. 5 the method further includes coupling a number of redundant output circuit lines to the multiplexor.

Figure 6:
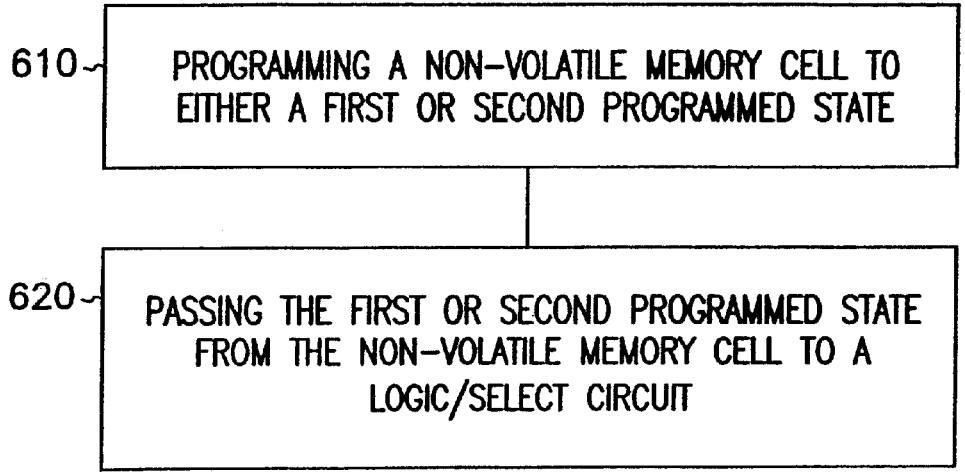
FIG. 6 illustrates, in flow diagram form, a method for operating a switch on a DRAM chip according to the teachings of the present invention.

FIG. 6 illustrates, in flow diagram form, a method for operating a switch on a DRAM chip according to the teachings of the present invention. The method includes programming a non-volatile memory cell to either a first or second programmed state 610. The non-volatile memory cell includes a metal oxide semiconductor field effect transistor (MOSFET) formed in a semiconductor substrate, includes a capacitor, and includes a vertical electrical via coupling a bottom plate of the capacitor through an insulator layer to a gate of MOSFET. The method further includes passing the first or second programmed state from the non-volatile memory cell to a logic/select circuit 620. Passing the first or second programmed state to the logic/select circuit includes causing a multiplexor associated with the non-volatile memory cell to couple a first circuit line to a second circuit line when the non-volatile memory cell is in a first programmed state, and includes causing the multiplexor to decouple the first circuit line from the second circuit line when the non-volatile memory cell is in a second programmed state.

Figure 7:
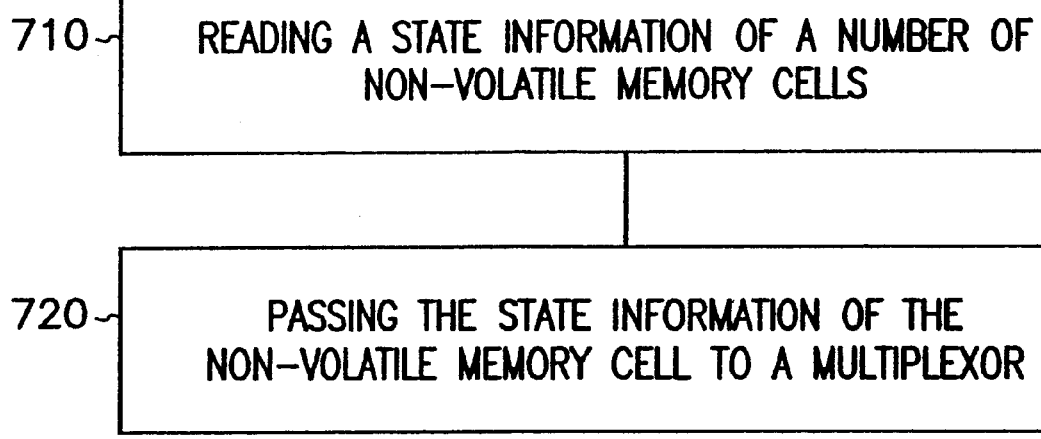
FIG. 7 illustrates, in flow diagram form, a method for replacing inoperable circuit lines on a DRAM chip.

FIG. 7 illustrates, in flow diagram form, a method for replacing inoperable circuit lines on a DRAM chip. The method includes reading a state information of a number of non-volatile memory cells 710. Each non-volatile memory cell includes a metal oxide semiconductor field effect transistor (MOSFET) formed in a semiconductor substrate, a stacked capacitor formed according to a dynamic random access memory (DRAM) process. The stacked capacitor is formed in a subsequent layer above the MOSFET and separated from the MOSFET by an insulator layer. An electrical contact couples a bottom plate of the stacked capacitor through the insulator layer to a gate of the MOSFET. The method further includes passing the state information of the non-volatile memory cell to a multiplexor 720. Passing the state information to the multiplexor includes causing the multiplexor to switch the coupling of an input circuit line from a first output circuit line to a second circuit line. In one embodiment, passing the state information to the multiplexor includes passing the state information to the multiplexor through a logic/select circuit. In one embodiment, the method of FIG. 7 further includes programming at least one of the non-volatile memory cells to a first programmed state after testing an integrated circuit die. In the method of FIG. 7, causing the multiplexor to switch the coupling of an input circuit line includes causing the multiplexor to switch the coupling of the input circuit line when the non-volatile memory cell is in a first programmed state. In one embodiment, causing the multiplexor to switch the coupling of an input circuit line from a first output circuit line to a second output circuit line includes causing the multiplexor to switch the coupling of the input circuit line to a redundant circuit line.

Figure 8:
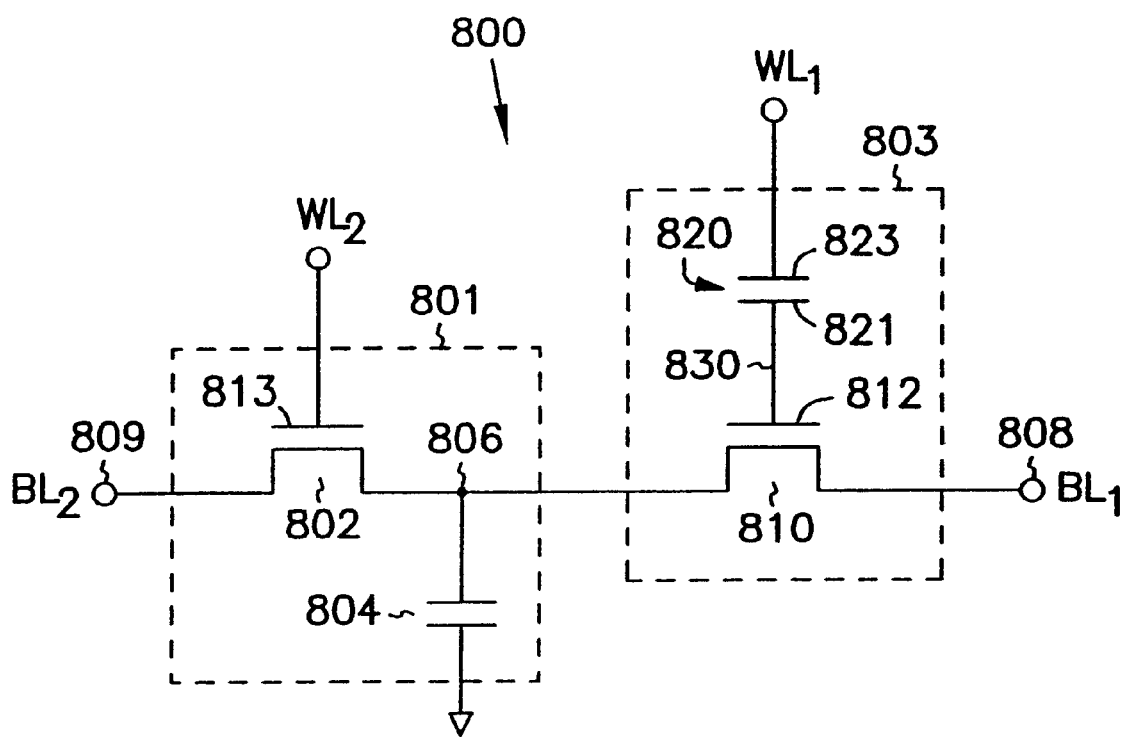
FIG. 8 is schematic diagram illustrating a shadow random access memory (RAM) cell according to the teachings of the present invention.

FIG. 8 is schematic diagram illustrating a shadow random access memory (RAM) cell 800 according to the teachings of the present invention. As shown in FIG. 8, the shadow RAM cell 800 includes a dynamic random access memory (DRAM) cell 801 coupled to a non-volatile memory cell 803. The non-volatile memory cell 803 includes the non-volatile memory cell structure presented and described in detail above in connection with FIG. 2. That is, the non-volatile memory cell 803 includes a first metal oxide semiconductor field effect transistor (MOSFET) 810 formed in a substrate, not shown on the schematic diagram, but shown in FIG. 2. The non-volatile memory cell 803 has a first capacitor 820. A bottom plate 821 of the first capacitor 820 is coupled a gate 812 of the first MOSFET 810 by a vertical electrical via 830, or electrical contact 830. The electrical contact couples the bottom plate 821 to the gate 812 through an insulator layer, not shown on the schematic diagram, but shown in FIG. 2.

The DRAM cell 801 includes second MOSFET 802 and a second capacitor 804. In one embodiment, the second capacitor 804 includes a stacked capacitor 804. A first diffused region 806 is shared between the second MOSFET 802 of the DRAM cell 801 and the first MOSFET 810 of the non-volatile memory cell 403. In the embodiment shown in FIG. 8, a first bit line $BL_1$ couples to a second diffused region 808 of the first MOSFET 810. A second bit line $BL_2$ couples to a second diffused region 809 of the second MOSFET 802. A first wordline $WL_1$ couples to a top plate 823 of the first capacitor 820. A second wordline $WL_2$ couples to the gate 813 of the second MOSFET 802. As shown in FIG. 2, one embodiment of the non-volatile memory cell 803 includes a first capacitor 820 which is a stacked capacitor 802 formed in a subsequent layer above the first MOSFET 810 according to a dynamic random access memory (DRAM) process flow. In one embodiment, the first MOSFET 810 includes an n-channel metal oxide semiconductor (NMOS) transistor 810. In one embodiment, the second MOSFET 802 includes n-channel metal oxide semiconductor (NMOS) transistor 802. One of ordinary skill in the art will understand upon reading this disclosure that the doping and polarity of these transistors may be reversed to form alternate combinations of p-type and n-type transistors.

Figure 9:
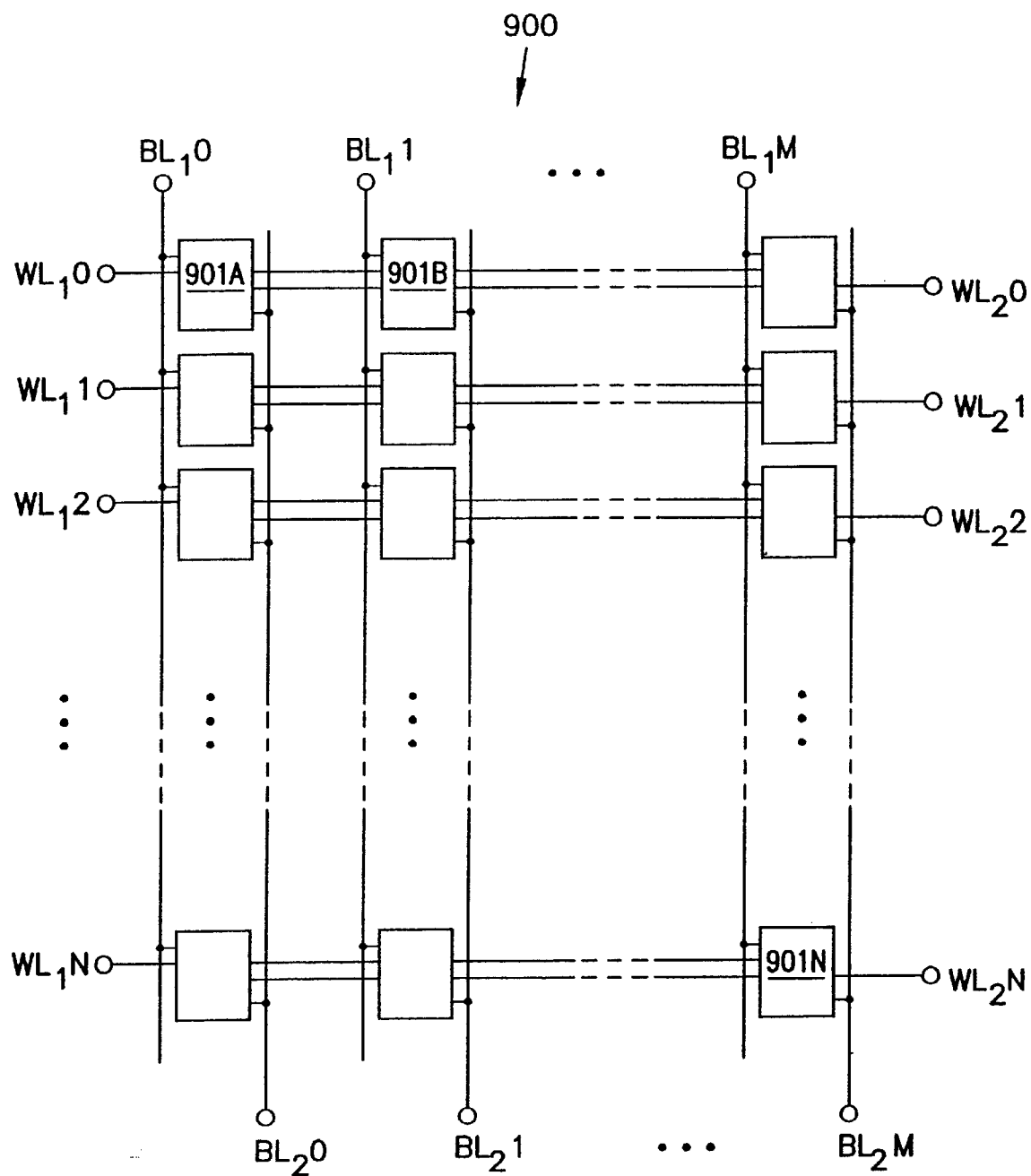
FIG. 9 illustrates, in block diagram form, an array of shadow RAM cells according to the teachings of the present invention.

FIG. 9 illustrates, in block diagram form, an array of shadow RAM cells 900 according to the teachings of the present invention. In FIG. 9, a number of shadow RAM cells are shown as 901A, 901B, . . . , 901N. FIG. 9 illustrates one arrangement of the shadow RAM cells 901A, 901B, . . . , 901N. Any number of shadow RAM cells are shown as 901A, 901B, . . . , 901N may be interconnected in any parallel or series arrangement to execute complex date storage and retrieval. In the embodiment of FIG. 9, each of the shadow RAM cells 901A, 901B, . . . , 901N is constructed alike and includes the structure presented and described in detail in connection with FIG. 8. As shown in FIG. 9, a number of control lines, or first wordlines, $WL_10$, $WL_11$, . . . , $WL_1N$, couple to the number of shadow RAM cells 901A, 901B, . . . , 901N. The number of control lines, or first wordlines, $WL_10$, $WL_11$, . . . , $WL_1N$, similarly couple to other circuitry of an integrated circuit, not shown. As explained in connection with FIG. 8, the first wordlines, $WL_10$, $WL_11$, . . . , $WL_1N$, couple a top plate of a first capacitor in each of the number shadow RAM cells 901A, 901B, . . . , 901N. A number of second wordlines, $WL_20$, $WL_21$, . . . , $WL_2N$, also couple to the number of shadow RAM cells 901A, 901B, . . . , 901N. The number of second wordlines, $WL_20$, $WL_21$, . . . $WL_2N$, similarly couple to other circuitry of an integrated circuit, not shown. As explained in connection with FIG. 8, the second wordlines, $WL_20$, $WL_2$ 1 . . . $WL_2N$, couple a gate of a second MOSFET in each of the number shadow RAM cells 901A, 901B, . . . , 901N. A first group of bit lines, $BL_10$, $BL_11$, . . . , $BL_1M$, are coupled to the number of shadow RAM cells 901A, 901B, . . . , 901N in the shadow RAM cell array 900. The first group of bit lines, $BL_10$, $BL_11$, . . . , $BL_1M$, similarly couple to other circuitry of an integrated circuit, not shown. As explained in connection with FIG. 8, the first group of bit lines, $BL_10$, $BL_11$, . . . , $BL_1M$, are coupled to a second diffused region of the first MOSFET in each of the number shadow RAM cells 901A, 901B, . . . , 901N. A second group of bit lines, $BL_20$, $BL_21$, . . . , $BL_2M$, are coupled to the number of shadow RAM cells 901A, 901B, . . . , 901N in the shadow RAM cell array 900. The second group of bit lines, $BL_20$, $BL_21$, . . . $BL_2M$, similarly couple to other circuitry of an integrated circuit, not shown. As explained in connection with FIG. 8, the second group of bit lines, $BL_20$, $BL_21$, . . . , $BL_2M$, are coupled to a second diffused region of the second MOSFET in each of the number shadow RAM cells 901A, 901B, . . . , 901N. One of ordinary skill in the art will understand upon reading this disclosure the various suitable manners in which a voltage potential may be applied to the numerous bit lines and wordlines shown in FIG. 9. The same is not discussed in detail here so as not to obscure the inventive features of the novel shadow RAM cell array 900, one of which includes the application of a novel shadow RAM cells 901A, 901B, . . . , 901N in the above circuit implementation. In one embodiment of the present invention, the novel shadow RAM cell array 900 is included on the DRAM chip 320 of the electronic system described above in connection with FIG. 3. In one embodiment of the present invention, the novel shadow RAM cell array 900 included as part of the electronic system 300 comprises a beginning input/output system (BIOS).

Figure 10:
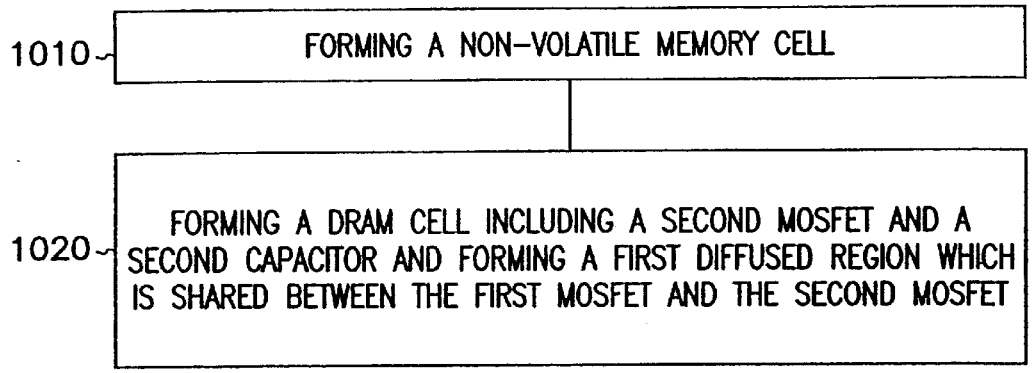
FIG. 10 illustrates, in flow diagram form, a method for forming a shadow random access memory (RAM) cell according to the teachings of the present invention.

FIG. 10 illustrates, in flow diagram form, a method for forming a shadow random access memory (RAM) cell according to the teachings of the present invention. The method includes forming a non-volatile memory cell 1010. Forming the non-volatile memory cell includes forming a first metal oxide semiconductor field effect transistor (MOSFET) in a semiconductor substrate, forming a first capacitor, and forming a vertical electrical via which couples a bottom plate of the first capacitor through an insulator layer to a gate of first MOSFET. The method of forming a non-volatile memory cell 1010 is designed to produce the structure shown in FIG. 2. The method of FIG. 10 includes forming a dynamic random access memory (DRAM) cell including a second MOSFET and a second capacitor, where forming the DRAM cell includes forming a first diffused region which is shared between the first MOSFET and the second MOSFET 1020.

Figure 11:
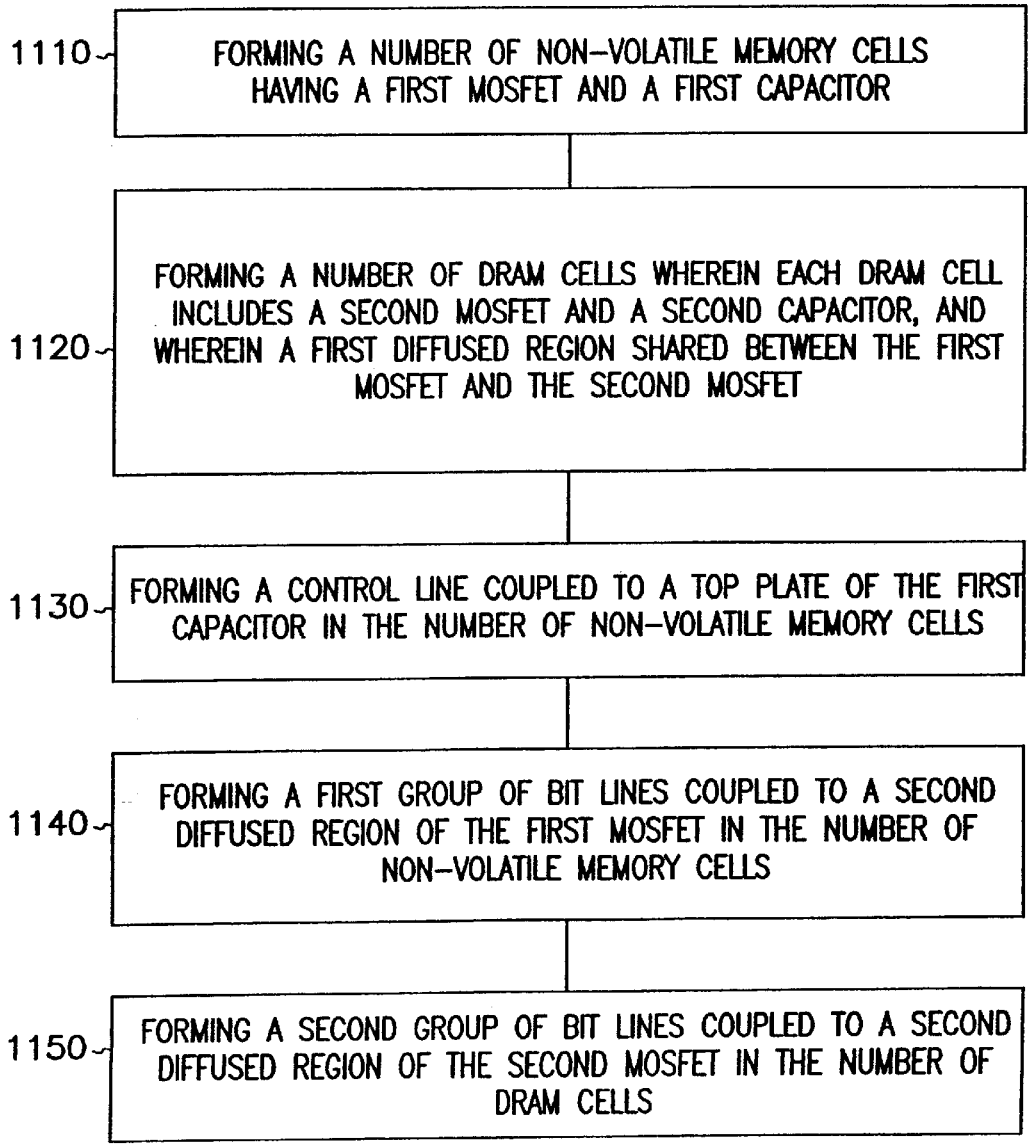
FIG. 11 illustrates, in flow diagram form, a method for forming an array of shadow RAM cells according to the teachings of the present invention.

FIG. 11 illustrates, in flow diagram form, a method for forming an array of shadow RAM cells according to the teachings of the present invention. The method includes forming a number of non-volatile memory cells 1110. Forming each non-volatile memory cell includes forming a metal oxide semiconductor field effect transistor (MOSFET) in a semiconductor substrate. Forming each non-volatile memory cell includes forming a first capacitor according to a dynamic random access memory (DRAM) process in a subsequent layer above the MOSFET and separated from the MOSFET by an insulator layer. And, forming each non-volatile memory cell includes coupling an electrical contact between a bottom plate of the stacked capacitor through the insulator layer to the gate of MOSFET. The method of forming a non-volatile memory cell 1110 is designed to produce the structure shown in FIG. 2. The method of FIG. 11 further includes forming a number of dynamic random access memory (DRAM) cells, where each DRAM cell includes a second MOSFET and a second capacitor coupled to a first diffused region for the second MOSFET, and where a first diffused region is shared between the first MOSFET and the second MOSFET 1120. The method includes forming a control line coupled to a top plate of the first capacitor in the number of non-volatile memory cells 1130. The method includes forming a first group of bit lines coupled to a second diffused region of the first MOSFET in the number of non-volatile memory cells 1140. The method further includes forming a second group of bit lines coupled to a second diffused region of the second MOSFET in the number of DRAM cells 1150.

Figure 12:
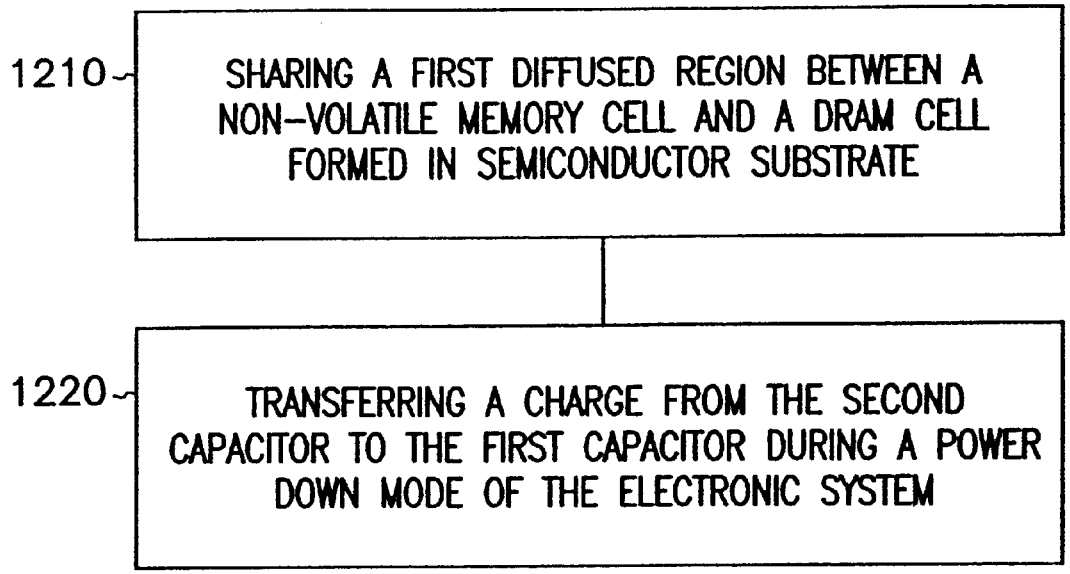
FIG. 12 illustrates, in flow diagram form, a method for storing data in an electronic system according to the teachings of the present invention.

FIG. 12 illustrates, in flow diagram form, a method for storing data in an electronic system according to the teachings of the present invention. The method includes sharing a first diffused region between a non-volatile memory cell and a dynamic random access memory (DRAM) cell formed in a semiconductor substrate 1210. The non-volatile memory cell includes a first metal oxide semiconductor field effect transistor (MOSFET) formed in a substrate. The non-volatile memory cell includes a first capacitor, and a vertical electrical via coupling a bottom plate of the first capacitor through an insulator layer to a gate of first MOSFET. In the method of FIG. 12, the DRAM cell includes a second MOSFET and a second capacitor. The method of Figure includes transferring a charge from the second capacitor to the first capacitor during a power down mode of the electronic system 1220. In one embodiment, the method of FIG. 12 further includes transferring a charge from the second capacitor to the first capacitor during a power failure of the electronic system. In one embodiment, transferring a charge from the second capacitor to the first capacitor includes transferring a charge from a stacked capacitor formed according to a DRAM process flow to a floating gate capacitor of a non-volatile memory cell formed according to the same process flow. In one embodiment, the method of FIG. 12 further includes transferring a charge from the first capacitor to the second capacitor during a power up mode of the electronic system.

CONCLUSION

Thus, successful additional applications for DRAM technology compatible non-volatile memory cells have been presented. The novel applications include the integration of DRAM technology compatible non-volatile memory cells which can be fabricated on a DRAM chip with little or no modification of the DRAM optimized process flow. The novel applications of DRAM technology compatible non-volatile memory cells operate with lower programming voltages than that used by conventional non-volatile memory cells, yet still hold sufficient charge to withstand the effects of parasitic capacitances and noise due to circuit operation.

The above novel applications include use of the DRAM technology compatible non-volatile memory cells as circuit switches. Such circuit switches can be used for device identification or serial numbering, as well as device performance characteristics, e.g. device speed. The versatility of the present invention allows construction of a large number of non-volatile memory cells into which these functions can be programmed either during initial manufacturing (by changing contact masks and/or metal layer masks) to be either non-volatile memory cells, DRAM cells, or shadow RAM cells. Alternatively these functions can be programmed into the DRAM chip over the life of the product, allowing additional changes later in the field if conditions warrant.

The above novel applications include use for redundancy/repair and option selection on a DRAM chip. The applications further include use for storing capability information about the DRAM chip, such as number and location of bad bits or sectors. In this manner, an electronic system can map around damaged areas of a DRAM chip. This allows the rest of the DRAM chip to be used rather than discarding a less than 100% perfect DRAM chip. Significant economic savings in production will thus be gained, especially as DRAM chip densities move higher.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of forming a circuit switch, comprising:
   forming a non-volatile memory cell, wherein forming the non-volatile memory cell includes:
     forming a metal oxide semiconductor field effect transistor (MOSFET) in a semiconductor substrate;
     forming a stacked capacitor according to a dynamic random access memory (DRAM) process flow; and
     forming a vertical electrical via, wherein forming the vertical electrical via includes coupling a bottom plate of the stacked capacitor through an insulator layer to a gate of MOSFET;
   forming a wordline coupled to a top plate of the stacked capacitor in the non-volatile memory cell;
   forming a sourceline coupled to a source region of the MOSFET in the non-volatile memory cell; and
   forming a bit line coupled to a drain region of the MOSFET in the non-volatile memory cell and coupled to a logic/select circuit.

2. The method of claim 1, wherein forming the stacked capacitor includes forming the bottom plate of the stacked capacitor in a cup shape having interior walls and exterior walls and is separated by a capacitor dielectric from the top plate.

3. The method of claim 1, wherein forming the capacitor dielectric includes forming the capacitor dielectric conformal to the bottom plate, and forming the top plate conformal to the capacitor dielectric, a portion of the top plate being located within the interior walls of the bottom plate.

4. The method of claim 1, wherein forming the non-volatile memory cell includes forming an EEPROM cell.

5. The method of claim 1, wherein forming the logic/select circuit includes coupling the logic/select circuit to a multiplexor, and coupling a first circuit line and second circuit line to the multiplexor such that the multiplexor couples the first circuit line to the second circuit line when the non-volatile memory cell is in a first programmed state, and such that the multiplexor decouples the first circuit line from the second circuit line when the non-volatile memory cell is in a second programmed state.

6. The method of claim 5, wherein coupling the second circuit line to the multiplexor includes coupling a redundant DRAM wordline to the multiplexor.

7. A method for forming a circuit switch array, comprising:
  forming a number of non-volatile memory cells, wherein forming each non-volatile memory cell includes:
    forming a metal oxide semiconductor field effect transistor (MOSFET) in a semiconductor substrate;
    forming a stacked capacitor according to a dynamic random access memory (DRAM) process in a subsequent layer above the MOSFET and separated from the MOSFET by an insulator layer; and
    forming an electrical contact, wherein forming the electrical contact includes coupling a bottom plate of the stacked capacitor through the insulator layer to the gate of MOSFET;
  coupling a control line to a top plate of the stacked capacitor in the number of non-volatile memory cells;
  coupling a sourceline to a source region of the MOSFET in the number of non-volatile memory cells; and
  coupling a bit line to a drain region of the MOSFET in the number of non-volatile memory cells and coupling the bit line to a multiplexor which couples a number of input circuit lines to a number of output circuit lines.

8. The method of claim 7, wherein coupling the bit line to a multiplexor includes coupling the bit line to a logic/select circuit and coupling the logic/select to the multiplexor.

9. The method of claim 7, wherein the method further includes coupling a number of redundant output circuit lines to the multiplexor.

10. A method for forming a circuit repair array, comprising:
  forming a number of non-volatile memory cells on a dynamic random access memory (DRAM) chip, wherein forming each non-volatile memory cell includes:
    forming a metal oxide semiconductor field effect transistor (MOSFET) in a semiconductor substrate;
    forming a stacked capacitor according to a DRAM process in a subsequent layer above the MOSFET and separated from the MOSFET by an insulator layer, wherein a bottom plate of the stacked capacitor is cup shaped having interior walls and exterior walls and is separated by a capacitor dielectric from a top plate;
    forming an electrical contact, wherein forming the electrical contact includes coupling the bottom plate of the stacked capacitor through the insulator layer to the gate of MOSFET;
  coupling a control line to the top plate of the stacked capacitor in the number of non-volatile memory cells;
  coupling a sourceline to a source region of the MOSFET in the number of non-volatile memory cells; and
  coupling a bit line to a drain region of the MOSFET in the number of non-volatile memory cells and coupling the bit line to a multiplexor which couples a number of input circuit lines to a number of output circuit lines.

11. The method of claim 10, wherein forming the stacked capacitor includes forming a capacitor dielectric conformal to the bottom plate, and forming the top plate conformal to the capacitor dielectric, a portion of the top plate being located within the interior walls of the bottom plate.

12. The method of claim 10, wherein forming each non-volatile memory cell includes forming an EEPROM cell.

13. The method of claim 10, wherein coupling the bit line to the multiplexor includes coupling a bit line to a logic/select circuit and coupling the logic/select circuit to a multiplexor.

14. The method of claim 10, wherein the method further includes coupling a number of redundant output circuit lines to the multiplexor.

15. A method for forming an electronic system, comprising:
  forming a processor;
  coupling a system bus to the processor;
  forming a dynamic random access memory (DRAM) chip coupled to the system bus;
  forming a circuit switch on the DRAM chip including:
    forming a non-volatile memory cell, wherein forming the non-volatile memory cell includes:
      forming a metal oxide semiconductor field effect transistor (MOSFET) in a semiconductor substrate;
      forming a stacked capacitor according to a DRAM process in a subsequent layer above the MOSFET and separated from the MOSFET by an insulator layer, wherein a bottom plate of the stacked capacitor is cup shaped having interior walls and exterior walls and is separated by a capacitor dielectric from a top plate;
      forming a vertical electrical via, wherein forming the vertical electrical via includes coupling the bottom plate of the stacked capacitor through an insulator layer to a gate of MOSFET;
    forming a wordline coupled to the top plate of the stacked capacitor in the non-volatile memory cell;
    forming a sourceline coupled to a source region of the MOSFET in the non-volatile memory cell; and
    forming a bit line coupled to a drain region of the MOSFET in the non-volatile memory cell and coupled to a logic/select circuit.

16. The method of claim 15, wherein forming the stacked capacitor includes forming a capacitor dielectric conformal to the bottom plate, and forming the top plate conformal to the capacitor dielectric, a portion of the top plate being located within the interior walls of the bottom plate.

17. The method of claim 15, wherein forming the non-volatile memory cell includes forming an EEPROM cell.

18. The method of claim 15, wherein forming the bit line coupled to the logic/select circuit includes coupling the logic/select circuit to a multiplexor, and coupling a first circuit line and second circuit line to the multiplexor such that the multiplexor couples the first circuit line to the second circuit line when the non-volatile memory cell is in a first programmed state, and such that the multiplexor decouples the first circuit line from the second circuit line when the non-volatile memory cell is in a second programmed state.

19. The method of claim 18, wherein coupling the second circuit line to the multiplexor includes coupling a redundant DRAM wordline to the multiplexor.

20. A method for forming a shadow random access memory (RAM) cell, comprising:
   forming a non-volatile memory cell, wherein forming the non-volatile memory cell includes:
      forming a first metal oxide semiconductor field effect transistor (MOSFET) in a semiconductor substrate;
      forming a stacked capacitor according to a DRAM process in a subsequent layer above the first MOSFET and separated from the first MOSFET by an insulator layer, wherein a bottom plate of the stacked capacitor is cup shaped having interior walls and exterior walls and is separated by a capacitor dielectric from a top plate;
      forming a vertical electrical via which couples the bottom plate of the stacked capacitor through an insulator layer to a gate of the first MOSFET; and
   forming a dynamic random access memory (DRAM) cell including a second MOSFET and a second capacitor, wherein forming the DRAM cell includes forming a first diffused region which is shared between the first MOSFET and the second MOSFET.

21. The method of claim 20, wherein forming the stacked capacitor includes forming a capacitor dielectric conformal to the bottom plate, and forming the top plate conformal to the capacitor dielectric, a portion of the top plate being located within the interior walls of the bottom plate.

22. The method of claim 20, wherein forming the non-volatile memory cell includes forming an electronically erasable and programmable read only memory (EEPROM) cell.

23. The method of claim 20, wherein forming the first MOSFET includes forming an n-channel metal oxide semiconductor (NMOS) transistor.

24. A method for forming an array of shadow random access memory (RAM) cells, comprising:
   forming a number of non-volatile memory cells, wherein forming each non-volatile memory cell includes:
      forming a first metal oxide semiconductor field effect transistor (MOSFET) in a semiconductor substrate;
      forming a stacked capacitor according to a dynamic random access memory (DRAM) process in a subsequent layer above the first MOSFET and separated from the first MOSFET by an insulator layer, wherein a bottom plate of the stacked capacitor is cup shaped having interior walls and exterior walls and is separated by a capacitor dielectric from a top plate;
      coupling an electrical contact between the bottom plate of the stacked capacitor through the insulator layer to the gate of the first MOSFET;
   forming a number of DRAM cells, wherein each DRAM cell includes a second MOSFET and a second capacitor coupled to a first diffused region for the second MOSFET, and wherein the first diffused region is shared between the first MOSFET and the second MOSFET;
   forming a control line coupled to the top plate of the stacked capacitor in the number of non-volatile memory cells;
   forming a first group of bit lines coupled to a second diffused region of the first MOSFET in the number of non-volatile memory cells; and
   forming a second group of bit lines coupled to a second diffused region of the second MOSFET in the number of DRAM cells.

25. The method of claim 24, wherein forming a number of DRAM cells includes forming a second stacked capacitor coupled to a first diffused region for the second MOSFET.

26. The method of claim 24, wherein forming the stacked capacitor includes forming a capacitor dielectric conformal to the bottom plate, and forming the top plate conformal to the capacitor dielectric, a portion of the top plate being located within the interior walls of the bottom plate.

27. The method of claim 24, wherein forming each non-volatile memory cell includes forming an electronically erasable and programmable read only memory (EEPROM) cell.

28. The method of claim 24, wherein forming the array of shadow RAM cells includes forming a serial numbering device.

29. A method for forming an electronic system, comprising:
   forming a processor;
   coupling a system bus to the processor;
   forming a dynamic random access memory (DRAM) chip coupled to the system bus;
   forming a number of non-volatile memory cells on the DRAM chip, wherein forming each non-volatile memory cell includes:
      forming a first metal oxide semiconductor field effect transistor (MOSFET) in a semiconductor substrate;
      forming a stacked capacitor according to a dynamic random access memory (DRAM) process in a subsequent layer above the first MOSFET and separated from the first MOSFET by an insulator layer, wherein a bottom plate of the stacked capacitor is cup shaped having interior walls and exterior walls and is separated by a capacitor dielectric from a top plate;
      coupling an electrical contact between the bottom plate of the stacked capacitor through the insulator layer to the gate of the first MOSFET;
   forming a number of DRAM cells on the DRAM chip, wherein each DRAM cell includes a second MOSFET and a second capacitor coupled to a first diffused region for the second MOSFET, and wherein the first diffused region is shared between the first MOSFET and the second MOSFET;
   forming a control line coupled to the top plate of the stacked capacitor in the number of non-volatile memory cells;

forming a first group of bit lines coupled to a second diffused region of the first MOSFET in the number of non-volatile memory cells; and forming a second group of bit lines coupled to a second diffused region of the second MOSFET in the number of DRAM cells.

30. The method of claim 29, wherein forming a number of DRAM cells includes forming a second stacked capacitor coupled to a first diffused region for the second MOSFET.

31. The method of claim 29, wherein forming the stacked capacitor includes forming a capacitor dielectric conformal to the bottom plate, and forming the top plate conformal to the capacitor dielectric, a portion of the top plate being located within the interior walls of the bottom plate.

32. The method of claim 29, wherein forming each non-volatile memory cell includes forming an electronically erasable and programmable read only memory (EEPROM) cell.

33. The method of claim 29, wherein forming the array of shadow RAM cells includes forming a serial beginning input/output system (BIOS).

* * * * *

UNITED STATES PATENT AND TRADEMARK OFFICE
CERTIFICATE OF CORRECTION

PATENT NO. : 6,498,739 B2
DATED : December 24, 2002
INVENTOR(S) : Eugene H. Cloud and Wendell P. Noble Jr.

It is certified that error appears in the above-identified patent and that said Letters Patent is hereby corrected as shown below:

<u>Title page, Item [54] and Column 1, lines 1 and 2,</u>
Delete "APPLICATIONS FOR NON-VOLATILE MEMORY CELLS" and insert -- METHOD OF FORMING A MEMORY DEVICE --, therefor.

Signed and Sealed this

Twenty-fourth Day of June, 2003

JAMES E. ROGAN
*Director of the United States Patent and Trademark Office*